US008681825B2

(12) United States Patent
Wang et al.

(10) Patent No.: US 8,681,825 B2
(45) Date of Patent: Mar. 25, 2014

(54) GRATING EXTERNAL-CAVITY LASER AND QUASI-SYNCHRONOUS TUNING METHOD THEREOF

(75) Inventors: Shaokai Wang, Beijing (CN); Erjun Zang, Beijing (CN); Ye Li, Beijing (CN); Jianping Cao, Beijing (CN); Zhanjun Fang, Beijing (CN)

(73) Assignee: National Institute of Metrology Peoples Republic of China, Beijing (CN)

( * ) Notice: Subject to any disclaimer, the term of this patent is extended or adjusted under 35 U.S.C. 154(b) by 166 days.

(21) Appl. No.: 13/188,592

(22) Filed: Jul. 22, 2011

(65) Prior Publication Data

US 2012/0014399 A1    Jan. 19, 2012

Related U.S. Application Data

(63) Continuation-in-part of application No. 12/990,594, filed as application No. PCT/CN2009/000642 on Jun. 10, 2009.

(30) Foreign Application Priority Data

Jun. 18, 2008 (CN) .......................... 2008 1 0127037
Jul. 14, 2008 (CN) .......................... 2008 1 0116638
Jul. 22, 2010 (CN) .......................... 2010 1 0236535

(51) Int. Cl.
*H01S 3/098* (2006.01)
*H01S 3/086* (2006.01)

(52) U.S. Cl.
USPC .................. 372/18; 372/19; 372/20; 372/102

(58) Field of Classification Search
USPC ........................ 372/18, 19, 20, 102
See application file for complete search history.

(56) References Cited

U.S. PATENT DOCUMENTS

| 5,255,273 | A | * | 10/1993 | Nilsson et al. .................. 372/20 |
| 6,018,535 | A | | 1/2000 | Maeda |
| 6,026,100 | A | | 2/2000 | Maeda |
| 6,778,564 | B2 | | 8/2004 | Funakawa |
| 6,850,545 | B2 | | 2/2005 | Asami |
| 2007/0223554 | A1 | | 9/2007 | Hunter et al. |

FOREIGN PATENT DOCUMENTS

| CN | 101582561 A | 11/2009 |
| DE | 296 06 494 U1 | 6/1997 |

OTHER PUBLICATIONS

International Search Report from P.R. China in International Application PCT/CN2009/000642, mailed Sep. 3, 2009.

* cited by examiner

*Primary Examiner* — Jessica Stultz
*Assistant Examiner* — Marcia Golub-Miller
(74) *Attorney, Agent, or Firm* — Finnegan, Henderson, Farabow, Garrett & Dunner, L.L.P.

(57) ABSTRACT

A method for quasi-synchronous tuning of laser wavelength or frequency of grating external-cavity laser and a corresponding laser are provided. A grating or mirror is rotated around a quasi-synchronous tuning point ($P_q$) to achieve the quasi-synchronous tuning of frequency selections by grating and resonance cavity, wherein, on the xOy coordinate plane, from the perspective of actual physical space of the laser, the rotation center $P_q(x_q, y_q)$ satisfying the quasi-synchronous tuning condition can be considered as being extended from the rotation center $P_0(x_0, y_0)$ under the conventional synchronous tuning condition to the region enclosed by two parabolas near $P_0$. According to the present disclosure, approximately-synchronous tuning of laser is achieved with simple and flexible designs.

4 Claims, 17 Drawing Sheets

GRATING EXTERNAL-CAVITY LASER AND QUASI-SYNCHRONOUS TUNING METHOD THEREOF

CROSS-REFERENCE TO RELATED APPLICATIONS

This application is a continuation-in-part of U.S. application Ser. No. 12/990,594, filed on Nov. 1, 2010, which is a National Phase Application of International Application Number PCT/CN2009/000642, filed Jun. 10, 2009, and claims the benefit of priority of Chinese Patent App. Nos. 200810127037.5 and 200810116638.6 filed Jun. 18, 2008 and Jul. 14, 2008, respectively, and further claims the benefit of priority of Chinese Patent Application No. 201010236535.0, filed on Jul. 22, 2010, the contents of all of which are hereby incorporated by reference in their entirety.

TECHNICAL FIELD

The present disclosure relates to laser wavelength or frequency tuning of grating external-cavity lasers, wherein quasi-synchronous tuning is achieved by selecting tuning rotation center of the grating or mirror.

BACKGROUND

In the grating external-cavity lasers, there usually needs to tune the wavelength or frequency of generated laser and such tuning is realized by rotating grating to vary the incidence angle and diffraction angle of light on the grating, or by rotating mirror to vary the diffraction angle of light on the grating.

FIGS. 1, 2 and 3 show three types of grating external-cavity semiconductor lasers respectively. Wherein, FIG. 1 shows a conventional external-cavity semiconductor laser in a grazing-incidence configuration (i.e. the incidence angle is larger than the diffraction angle), also known as Littman configuration; FIG. 2 shows a novel external-cavity semiconductor laser in a grazing-diffraction configuration (i.e. the diffraction angle is larger than the incidence angle) proposed by the same applicant in Chinese patent application No. 200810097085.4; and FIG. 3 shows a conventional external-cavity semiconductor laser in Littrow configuration, in which there has no mirror and thus tuning is done only by rotating the grating.

Hereinafter, the basic configuration and principle of grating external-cavity laser will be discussed taking grating-feedback external-cavity semiconductor laser (ECDL) as an example. As shown in FIGS. 1-3, the semiconductor laser diode is represented as LD, the aspheric collimating lens is represented as AL, the grating is represented as G, the feedback mirror is represented as M, the normal of the grating is represented as N, the incidence angle of light on the grating is represented as $\theta_i$, the diffraction angle of light on the grating is represented as $\theta_d$, the difference between the incidence angle and the diffraction angle is $\Delta\theta$, that is, $\Delta\theta=\theta_i-\theta_d$, and $\Delta x$ is the optical path increment generated by the optical elements in the cavity (e.g. the gain media of the aspheric collimating lens and the LD).

In the grazing-incidence configuration shown in FIG. 1 and the grazing-diffraction configuration shown in FIG. 2, a laser beam emitted by the laser diode LD is incident on the diffraction grating G after the collimation of the aspheric collimating lens AL. The first order diffracting light from the grating G is normally incident on the feedback mirror M, which, after the reflection of the feedback mirror M, is re-diffracted by the grating along the path collinear with the incident light and in the direction opposite to the incident light, and then returns to the laser diode through the aspheric collimating lens AL following the original optical path.

In the Littrow configuration shown in FIG. 3, a laser beam emitted by the laser diode LD is incident on the diffraction grating G after the collimation of the aspheric collimating lens AL. The first order diffracting light from the grating G directly returns to the semiconductor laser diode through the aspheric collimating lens AL along the path collinear with the incident light and in the opposite direction of the incident light following the original optical path. It can be seen that, in the Littrow configuration, the incidence angle is equal to the diffraction angle of light on the grating, that is, $\theta=\theta_d=\theta$, and thus $\Delta\theta=0$.

In order to illustrate the tuning principle of external-cavity semiconductor lasers, a Cartesian coordinate system xOy is introduced in the figures, wherein the point O represents the intersection point of a laser beam emitted from semiconductor laser diode LD and the diffraction surface of grating G in its original position; the x axis runs through the point O and its direction is collinear with and opposite to that of the light emitted from LD; and the y axis runs through the point O upward and is perpendicular to the x axis.

The three planes of the equivalent LD rear facet, the diffraction surface of the grating G and the reflection surface of the mirror M are all perpendicular to the xOy coordination plane. The intersection line of the plane on which the diffraction surface of the grating lies and the xOy coordination plane is represented as SG, and the point O is on the intersection line; the intersection line of the plane on which the equivalent LD rear facet lies and the xOy coordination plane is represented as SL, which is separated from the point O by a distance l1; and the intersection line of the plane on which the reflection surface of the feedback mirror M lies and the xOy coordination plane is represented as SM, which is separated from the point O by a distance l2.

In the grazing-incidence configuration shown in FIG. 1 and grazing-diffraction configuration shown in FIG. 2, the optical distance between the point O and the equivalent LD rear facet and the optical distance between the point O and the feedback mirror M, i.e. the lengths of the two sub-cavities of the grating-external cavity, are represented as l1 and l2 respectively, and the whole optical length of cavity of the semiconductor laser is represented as the sum of them, i.e. l=l1+l2. In the Littrow configuration shown in FIG. 3, the actual optical cavity length of the laser is l1, that is, the distance between the point O and the equivalent LD rear facet.

When rotating the grating G or the mirror M to perform tuning, the rotational axis is perpendicular to the xOy coordinate plane, and the intersecting point of the rotational axis and the xOy coordinate plane (i.e., a rotation center) is denoted as P(x,y) in FIGS. 1-3. For convenience three distance parameters u, v and w are introduced, wherein u represents the distance between the rotation center P and the intersection line SM; v represents the distance between the rotation center P and the intersection line SG; and w represents the distance between the rotation center P and the intersection line SL. The signs of u, v and w are defined as follows: they are positive when the light and the rotation center are on the same side of the respective plane intersection lines, and they are negative when the light and rotation center are on the opposite sides of the respective plane intersection lines respectively. The distance v or u does not change when the grating G or the mirror M is rotated around the point P.

In grating external cavity semiconductor laser, there are two essential factors for laser wavelength or frequency determination:

1. frequency selection determined by the values of incidence angle and diffraction angle of the light on the grating and their variations;

2. frequency selection determined by the values of the cavity length of the equivalent F-P cavity formed by SL, SM and SG and their variations.

During the rotation of the grating or mirror around the rotation center P, both the frequency selection of the grating and the frequency selection of the F-P cavity change. In general, those changes are not synchronous, which will cause mode-hopping of the laser mode, thus will disrupt the continuous tuning of laser frequency, and hence, resulting in a very small continuous tuning range without mode-hopping, e.g., 1 to 2 GHz.

In order to achieve synchronous tuning of laser frequency or wavelength, i.e., achieve a large range of continuous frequency tuning without mode-hopping, the rotation center P of the grating G or the feedback mirror M needs to be selected purposefully.

Assuming that the grating or the mirror was rotated by an angle α with respect to its original position, the phase shift Ψ of laser beam after one round trip within the F-P cavity is:

$$\psi = \psi_0 + A(\alpha) \cdot [B \cdot \sin\alpha + C \cdot (1 - \cos\alpha)] \quad (1)$$

wherein, $\Psi_0$ is the original one round trip phase shift of the beam before the rotation tuning, $A(\alpha)$ is a function of the tuning rotation angle α. $\Psi_0$, B and C are functions that are irrelative to the angle α. $\Psi_0$, $A(\alpha)$, B and C relate to the original parameters of the external-cavity semiconductor laser, including original angles (for example, original incidence angle $\theta_i$, original diffraction angle $\theta_d$ etc.), original positions (for example, original cavity lengths $l1_0$ and $l2_0$, and original distances $u_0$, $v_0$ and $w_0$), and grating constant d, and the like. When full synchronous tuning conditions are satisfied, the phase shift Ψ should be independent of the rotation angle α, and thus, both B and C in Eq. (1) should be zero.

Here, the distance parameters of the rotation center $P_0$ fulfilling rigorous synchronous tuning should meet:

$$\begin{cases} u_0 + w_0 = 0 \\ v_0 = 0 \end{cases} \quad (2)$$

It is evident that the rotation center $P_0$ satisfying synchronous tuning conditions should lie on the intersection line of the plane on which the grating diffraction surface lies and the xOy coordinate plane; meanwhile, the distance $u_0$ from the rotation center $P_0$ to the plane on which the reflection surface of the mirror lies and the distance $w_0$ from $P_0$ to the plane on which the equivalent LD rear facet lies have the same absolute values and the opposite signs.

For grazing-incidence and grazing-diffraction configuration, the coordinate of the rotation center satisfying synchronous tuning conditions is represented as $P_0(x_0, y_0)$, which meet:

$$\begin{cases} x_0 = l_0 d \sin\theta i / \lambda \\ y_0 = l_0 d \cos\theta i / \lambda \end{cases} \quad (3)$$

Wherein, $x_0$, $y_0$ are abscissa and ordinate of the synchronous tuning rotation center $P_0$ respectively, $l_0$ is the equivalent cavity length of the F-P cavity at the original position, d is the grating constant, $\theta_i$ is the incidence angle of the light on the grating, and λ is the laser wavelength.

FIGS. 4 and 5 show the synchronous tuning of grazing-incidence configuration and grazing-diffraction configuration respectively.

FIG. 6 shows the synchronous tuning of the Littrow configuration. Since there has no mirror in the Littrow configuration, which means that $u_0 = w_0$, the distance parameter constraint conditions defined in Eq. (2) become:

$$\begin{cases} w_0 = 0 \\ v_0 = 0 \end{cases} \quad (4)$$

That is, the synchronous tuning center $P_0$ should at the intersecting point of the lines SG and SL.

Since $\theta_i = \theta_d = \theta$ and the actual optical cavity length is l1 in the Littrow configuration, when expressed by coordinate of $P_0(x_0, y_0)$, the distance parameter constraint conditions defined in Eq. (3) become:

$$\begin{cases} x_0 = l1_0 \\ y_0 = \dfrac{l1_0}{\tan\theta} \end{cases} \quad (5)$$

It can be seen from the above description that, regardless of whether the coordination parameter or the distance parameter is used, the position of the synchronous tuning rotation center $P_0$ needs to be defined by a equation group consisting of two equations, and the above two constraint conditions must be satisfied simultaneously, which means that there needs two adjustment mechanisms with the independent freedoms in the laser design. Despite for the grazing-incidence configuration, the grazing-diffraction configuration or the Littrow configuration, the position of the synchronous tuning rotation center $P_0$ can not leave from the SG plane on which the diffraction surface of the grating lies, which leads to disadvantages and difficulties in configuration design, adjustment and application of laser, while complicates the mechanical system and increases the instable factors.

In practice, a large continuous tuning range without mode-hopping may be affected by many other factors, for example, whether there is a AR(antireflection) coating applied on the LD surface and the quality of coating and the like. However, a continuous frequency tuning range of hundreds or even tens of GHz may be sufficient for many applications.

SUMMARY

The technical problem to be solved by the present disclosure is to find a method for performing approximately synchronous tuning (quasi-synchronous tuning) of grating external-cavity laser, which is not necessarily restricted by the restriction condition of rigorous synchronous tuning and renders the resultant continuous mode-hopping-free tuning range almost the same as in rigorous synchronous tuning, while renders the adjustment mechanism more stable, reliable and simple, without significantly degrading the quality of the laser.

According to the present disclosure, the technical problem is solved by a method for tuning a grating external-cavity laser, wherein a grating or a mirror of the laser is rotated around a quasi-synchronous tuning point, such that the distance between the plane on which the diffraction surface of the grating lies or the plane on which the reflection surface of the mirror lies and the quasi-synchronous tuning point does not change during the rotation, thereby achieving the quasi-synchronous tuning of the frequency selections by the grating and resonance cavity, wherein the quasi-synchronous tuning point is determined by:

determining a synchronous tuning point $P_0(x_0, y_0)$, such that when the grating or mirror is rotated around the synchronous tuning point $P_0$, the round trip phase difference of a laser beam within the resonance cavity of the grating external-cavity laser does not change;

a quasi-synchronous tuning range is determined by:
assuming that a given frequency tuning range is:

$$\Delta v = \frac{c}{\lambda(0)} \left( \frac{l_0}{1(\alpha_+)} - \frac{l_0}{1(\alpha_-)} \right) \quad (14)$$

wherein, c is the light speed in vacuum, $\lambda(0)$ is the central wavelength of laser light, $l_0$ is the original cavity length of the laser (that is, the cavity length when rotation angle $\alpha$ is zero), and $\alpha\pm$ are the maximal mode-hopping-free tuning angles allowed in positive and negative directions respectively, the optical length $l(\alpha)$ and the boundary condition at which mode-hopping occurs are:
for rotation of the mirror, $$l(\alpha) = \frac{SS(\alpha)}{SS(0)} \left[ l_0 - \frac{SS(0)}{SS(\alpha)} [Y\sin\alpha + X(1 - \cos\alpha)] \right] \quad (15)$$

$$\frac{|Y\sin\alpha + X(1 - \cos\alpha)|}{SS(\alpha)} \leq \frac{\lambda(0)}{4} \frac{1}{SS(0)} \quad (16)$$

for rotation of the grating, $$l(\alpha) = \frac{SS(\alpha)}{SS(0)} \left[ l_0 - \frac{2\cos\frac{\Delta\theta}{2}SS(0)}{SS(\alpha)} [Y\sin\alpha + X(1 - \cos\alpha)] \right] \quad (17)$$

$$\frac{2\cos\frac{\Delta\theta}{2}|Y\sin\alpha + K(1 - \cos\alpha)|}{SS(\alpha)} \leq \frac{\lambda(0)}{4} \frac{1}{SS(0)} \quad (18)$$

and for grating rotation, $$SS(\alpha) = \sin(\theta i - \alpha) + \sin(\theta d - \alpha) \quad (19)$$

for mirror rotation, $$SS(\alpha) = \sin\theta i + \sin(\theta d - \alpha) \quad (20)$$

wherein the newly introduced coordinator XOY is a rotation of xOy as defined in (8) and (9). The quasi-synchronous tuning range is defined as a region comprising points that cause the tuning range not less than $\Delta v$.

Optionally, according to present method, the quasi-synchronous tuning range can be further determined by:
making the following coordinate transformation:
for the grating rotation tuning, $$\begin{cases} Y = \left[(x - x_0)\sin\frac{\Delta\theta}{2} + (y - y_0)\cos\frac{\Delta\theta}{2}\right] \\ X = \left[(x - x_0)\cos\frac{\Delta\theta}{2} - (y - y_0)\sin\frac{\Delta\theta}{2}\right] \end{cases} \quad (8)$$

for the mirror rotation tuning, $$\begin{cases} Y = (x - x_0)\sin\Delta\theta + (y - y_0)\cos\Delta\theta \\ X = (x - x_0)\cos\Delta\theta - (y - y_0)\sin\Delta\theta \end{cases} \quad (9)$$

wherein the quasi-synchronous tuning range comprises the region enclosed by the two parabolas described by Eq. (10), and the region bounded between the two symmetrical axes of the parabolas and outside the top of those parabolas as defined by Eq. (11):

$$\begin{cases} X \leq -\frac{(Y+b)^2}{2(a+c)} - \frac{a-c}{2} \\ X \geq \frac{(Y-b)^2}{2(a+c)} + \frac{a-c}{2} \end{cases} \quad (10)$$

$$-b \leq Y \leq b \quad (11)$$
and
$$-\frac{(Y+b)^2}{2(a+c)} - \frac{a-c}{2} \leq X \leq \frac{(Y-b)^2}{2(a+c)} + \frac{a-c}{2}$$

wherein, a, b and c are defined as:
for grating rotation, $$a = \frac{\lambda(0)}{8\cos\frac{\Delta\theta}{2}} \quad (12)$$

$$b = \frac{\lambda(0)}{8\cos\frac{\Delta\theta}{2}} \frac{\cos(\theta i) + \cos(\theta d)}{SS(0)}$$

$$c = 0$$

for mirror rotation, $$a = \frac{\lambda(0)}{4} \frac{\sin\theta d}{SS(0)} \quad (13)$$

$$b = \frac{\lambda(0)}{4} \frac{\cos\theta d}{SS(0)}$$

$$c = \frac{\lambda(0)}{4} \frac{\sin\theta i}{SS(0)}.$$

According to present disclosure, a corresponding external-cavity laser is also provided, which comprises a quasi-synchronous tuning mechanism for implementing the above-mentioned quasi-synchronous tuning method. The quasi-synchronous tuning mechanism rotates the grating or the mirror around the quasi-synchronous tuning rotation center determined as above to achieve the quasi-synchronous tuning of frequency selections by grating and resonance cavity. The external-cavity laser may be in a Littman configuration or grazing-diffraction configuration, as well as a Littrow configuration. In the case of external-cavity laser in Littrow configuration, the symmetrical axes of the two parabolas defined by Eq. (10) are parallel to the light incident on the grating, since the difference between the incidence angle and the diffraction angle is $\Delta\theta=0$.

By the solutions of the present disclosure, the number of synchronous tuning constraint conditions can be reduced, so that merely one adjustment freedom is required for the adjustment mechanism. The position of the rotation center is no longer limited to the intersection line SG of the plane on which the grating surface lies, thus resulting in more flexible and powerful synchronous tuning, facilitating realization of approximately synchronous rotational frequency or wavelength tuning of the laser.

DETAILED DESCRIPTION OF PREFERRED EMBODIMENTS

Figure 1:
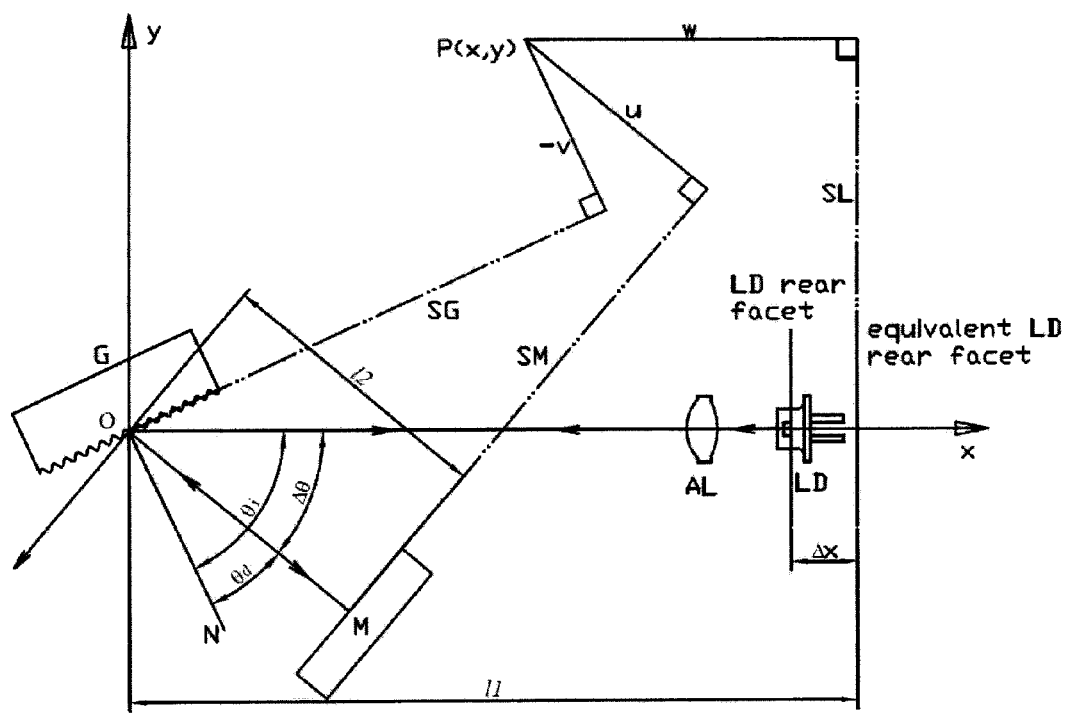
FIG. 1 shows a simplified view of grating external-cavity semiconductor laser in Littman (grazing-incidence) configuration in prior art.
Figure 2:
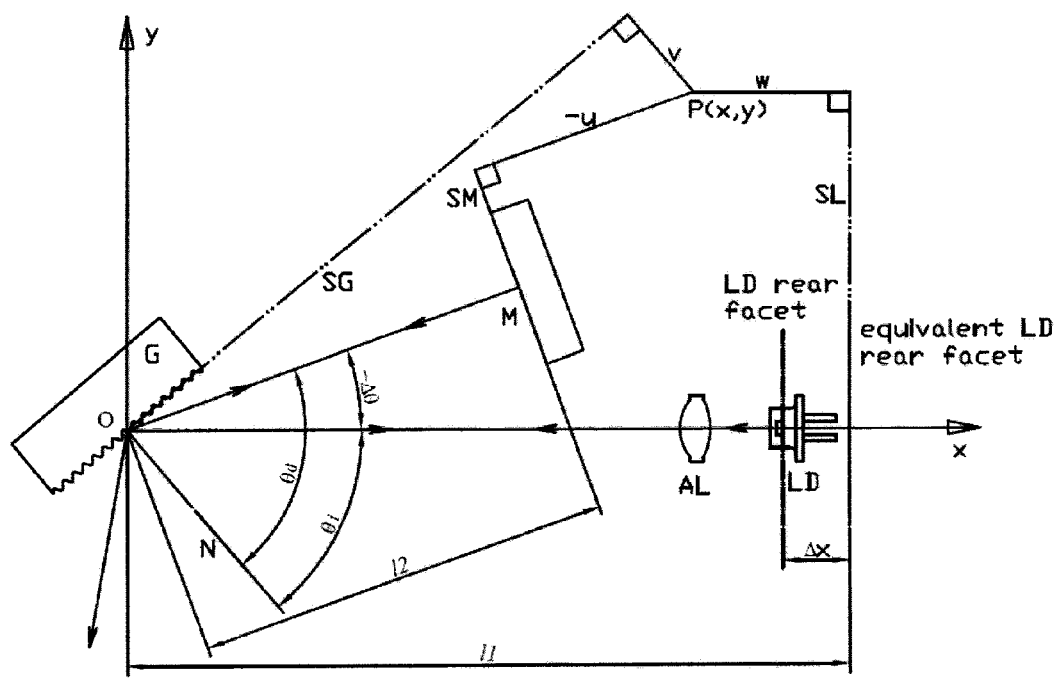
FIG. 2 shows a simplified view of grating external-cavity semiconductor laser in grazing-diffraction configuration in prior art.
Figure 3:
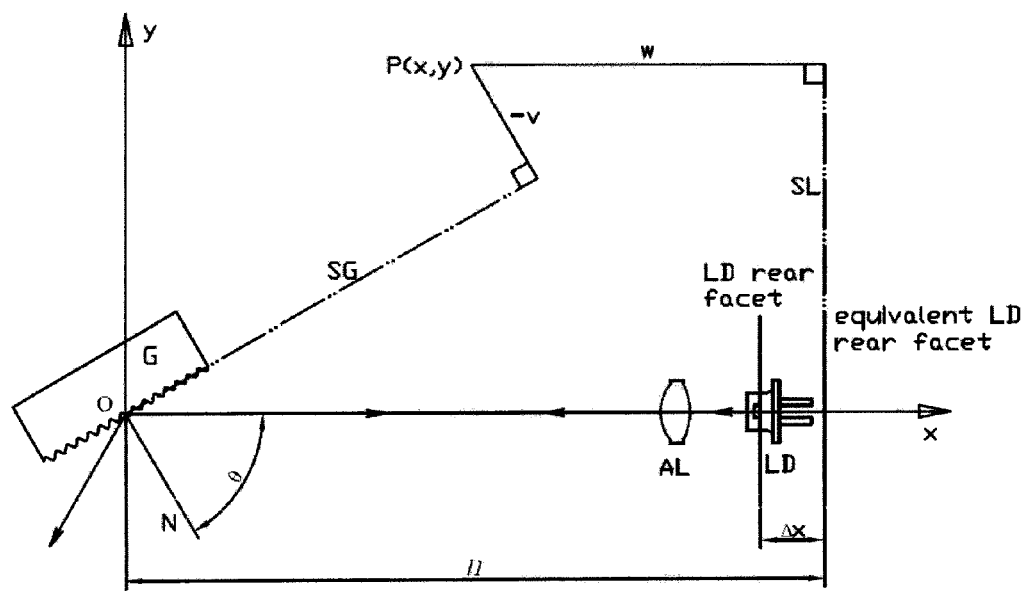
FIG. 3 shows a simplified view of grating external-cavity semiconductor laser in Littrow configuration in prior art.
Figure 4:
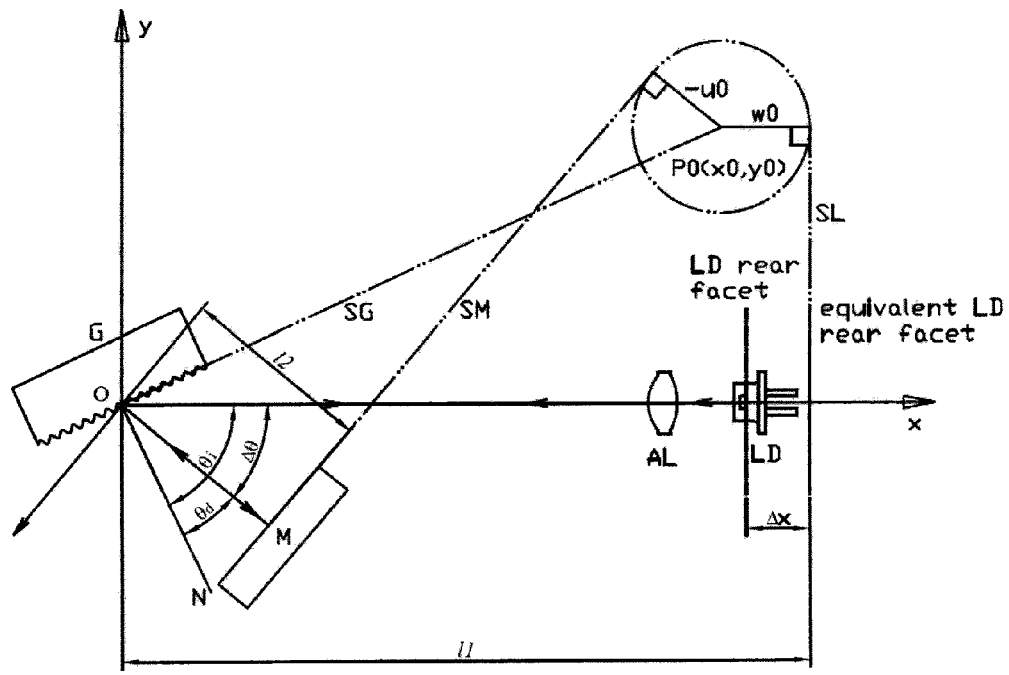
FIG. 4 shows the determination of the conventional synchronous tuning rotation center for Littman configuration in prior art.
Figure 5:
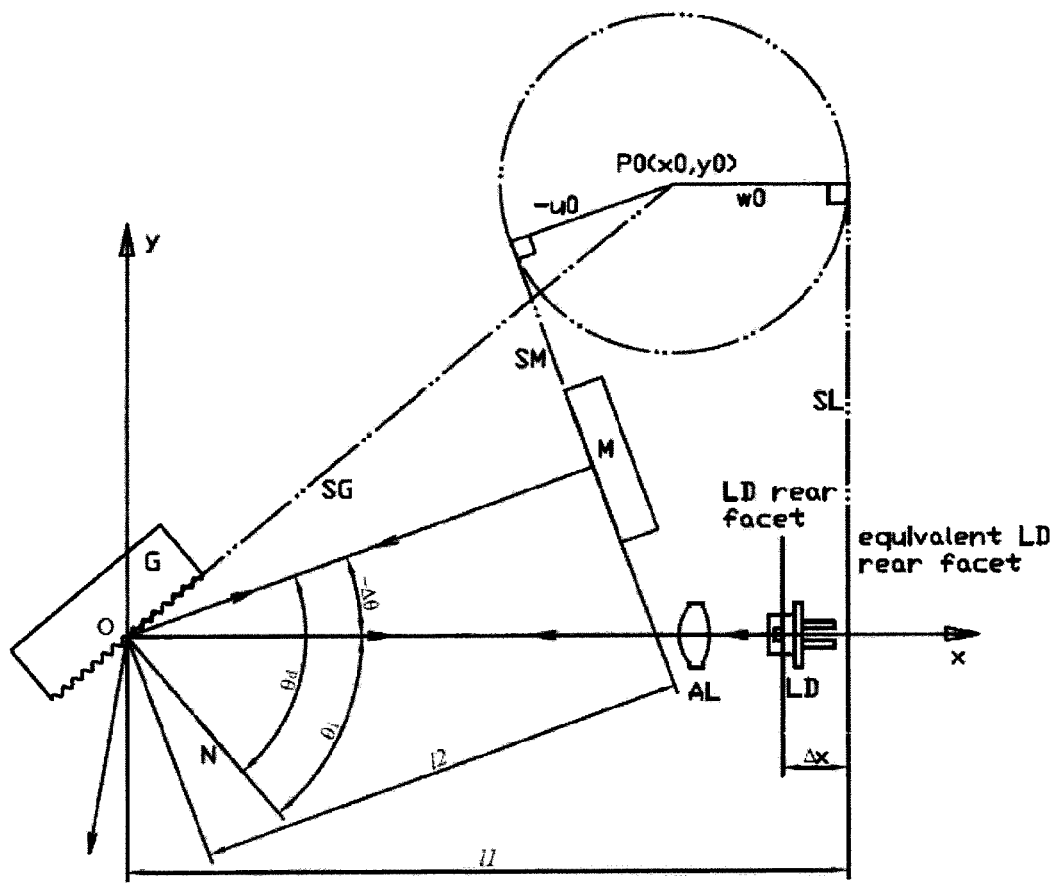
FIG. 5 shows the determination of the conventional synchronous tuning rotation center for grazing-diffraction configuration in prior art.
Figure 6:
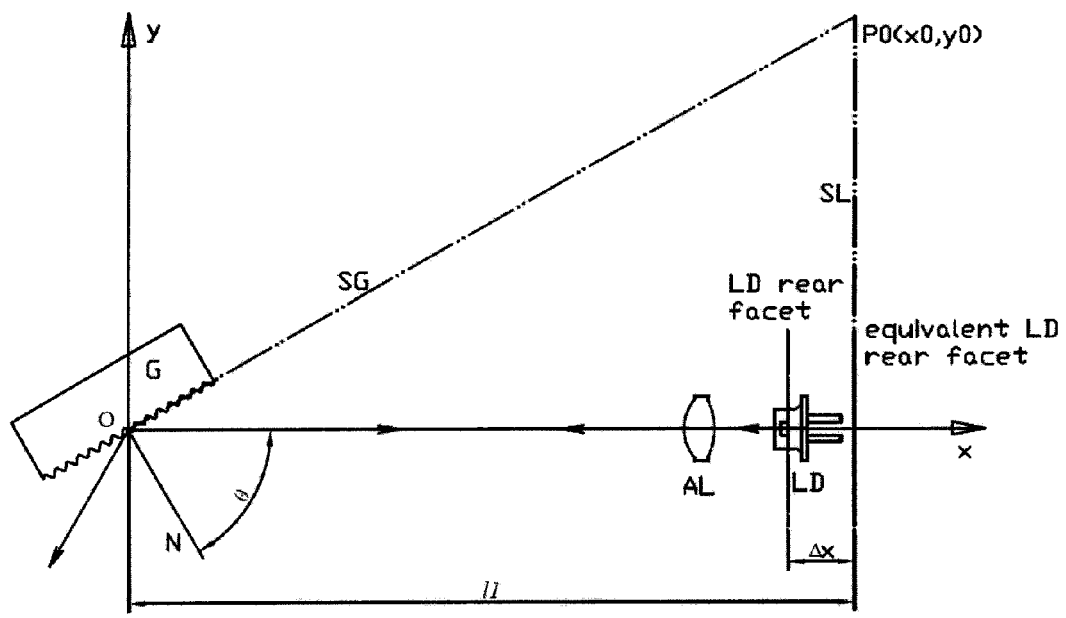
FIG. 6 shows the determination of conventional synchronous tuning rotation center for Littrow configuration in prior art.

The present disclosure is based on the following finds:

In the tuning phase shift described in the above Eq. (1), the tuning rotation angle $\alpha$, when represented in radian, is a small value approximating to zero and far less than 1. According to the Taylor series expansion theorem, it can be known that, the first item $\sin\alpha$ in the square brackets of Eq. (1) is the odd high-order item beginning from the first-order item of the tuning rotation angle $\alpha$, and the second item $(1-\cos\alpha)$ is even high-order item beginning from the second-order item of the tuning rotation angle $\alpha$, and so the second item $(1-\cos\alpha)$ is a small value higher ordered than $\sin\alpha$ and has far less contribution to the phase shift $\psi$ than $\sin\alpha$. Hence, by omitting the second-order and higher-order items in Eq. (1), the round trip phase shift $\psi$ can be approximately represented as:

$$\psi = \psi_0 + A(\alpha) \cdot B \cdot \sin\alpha \quad (6)$$

In this case, the coefficient B can be set to 0 in order to make the round trip phase shift $\psi$ irrelevant to the tuning rotation angle $\alpha$. That is, $$B = 0 \quad (7)$$

Such approximation is called quasi-synchronous tuning approximation, under which the frequency tuning of the external-cavity semiconductor laser is a quasi-synchronous tuning, wherein the rotation center of the corresponding grating or mirror is called quasi-synchronous tuning rotation center Pq with coordination $P_q(x_q, y_q)$. In the range of such approximation, the round trip phase shift caused by the rotation angle $\alpha$ can be omitted, i.e., $\psi \approx \psi_0$, which can be approximated as a constant irrelevant to the tuning rotation angle. In practice, almost all the parameters of external-cavity semiconductor laser and tuning range of rotation angle $\alpha$ meet such approximation condition.

According to the present disclosure, the technical problem is solved by a method for tuning a grating external-cavity laser, wherein a grating or a mirror of the laser is rotated around a quasi-synchronous tuning point, such that the distance between the plane on which the diffraction surface of the grating lies or the plane on which the reflection surface of the mirror lies and the quasi-synchronous tuning point does not change during the rotation, thereby achieving the quasi-synchronous tuning of the frequency selections by the grating and resonance cavity, wherein the quasi-synchronous tuning point is determined by:

making the following coordinate transformation:
for grating rotation tuning, $$\begin{cases} Y = \left[(x - x_0)\sin\dfrac{\Delta\theta}{2} + (y - y_0)\cos\dfrac{\Delta\theta}{2}\right] \\ X = \left[(x - x_0)\cos\dfrac{\Delta\theta}{2} - (y - y_0)\sin\dfrac{\Delta\theta}{2}\right] \end{cases} \quad (8)$$

wherein, $\Delta\theta = \theta_i - \theta_d$;
for mirror rotation tuning, $$\begin{cases} Y = (x - x_0)\sin\Delta\theta + (y - y_0)\cos\Delta\theta \\ X = (x - x_0)\cos\Delta\theta - (y - y_0)\sin\Delta\theta \end{cases} \quad (9)$$

The quasi-synchronous tuning range comprises the region enclosed by the two parabolas described by Eq. (10), and the region bounded between the two symmetrical axes of the parabolas and outside the top of those parabolas as described by Eq. (11):

$$\begin{cases} X < -\dfrac{(Y+b)^2}{2(a+c)} - \dfrac{a-c}{2} \\ X \geq \dfrac{(Y-b)^2}{2(a+c)} + \dfrac{a-c}{2} \end{cases} \quad (10)$$

$$-b \leq Y \leq b \quad (11)$$

and $$-\dfrac{(Y+b)^2}{2(a+c)} - \dfrac{a-c}{2} \leq X \leq \dfrac{(Y-b)^2}{2(a+c)} + \dfrac{a-c}{2}$$

wherein, a, b and c are defined as:
for grating rotation, $$a = \dfrac{\lambda(0)}{8\cos\dfrac{\Delta\theta}{2}} \quad (12)$$

$$b = \dfrac{\lambda(0)}{8\cos\dfrac{\Delta\theta}{2}} \dfrac{\cos(\theta i) + \cos(\theta d)}{SS(0)}$$

$$c = 0$$

for mirror rotation, $$a = \dfrac{\lambda(0)}{4} \dfrac{\sin\theta d}{SS(0)} \quad (13)$$

$$b = \dfrac{\lambda(0)}{4} \dfrac{\cos\theta d}{SS(0)}$$

$$c = \dfrac{\lambda(0)}{4} \dfrac{\sin\theta i}{SS(0)}.$$

In fact, a continuous tuning range of laser frequency of hundreds or even tens GHz may satisfy the requirement of rather many applications. Consequently, the range of quasi-synchronous tuning also can be determined by:
assuming that a given frequency tuning range is:

$$\Delta v = \dfrac{c}{\lambda(0)}\left(\dfrac{l_0}{1(u_+)} - \dfrac{l_0}{1(u_-)}\right) \quad (14)$$

wherein, c is the light speed in vacuum, $\lambda(0)$ is the central wavelength of laser light, $l_0$ is the original cavity length of the laser (that is, the cavity length when the rotation angle is zero), and $a\pm$ are the maximal mode-hopping-free tuning angles allowed in positive and negative directions respectively, the optical length $l(\alpha)$ and the boundary condition at which mode-hopping occurs are:
for the mirror rotation, $$l(\alpha) = \dfrac{SS(\alpha)}{SS(0)}\left[l_0 - \dfrac{SS(0)}{SS(\alpha)}[Y\sin\alpha + X(1-\cos\alpha)]\right] \quad (15)$$

$$\dfrac{|Y\sin\alpha + X(1-\cos\alpha)|}{SS(\alpha)} \leq \dfrac{\lambda(0)}{4}\dfrac{1}{SS(0)} \quad (16)$$

for the grating rotation, $$l(\alpha) = \dfrac{SS(\alpha)}{SS(0)}\left[l_0 - \dfrac{2\cos\dfrac{\Delta\theta}{2}SS(0)}{SS(\alpha)}[Y\sin\alpha + X(1-\cos\alpha)]\right] \quad (17)$$

$$\dfrac{2\cos\dfrac{\Delta\theta}{2}|Y\sin\alpha + X(1-\cos\alpha)|}{SS(\alpha)} \leq \dfrac{\lambda(0)}{4}\dfrac{1}{SS(0)} \quad (18)$$

and for grating rotation, $$SS(\alpha) = \sin(\theta i - \alpha) + \sin(\theta d - \alpha) \quad (19)$$

for mirror rotation, $$SS(\alpha) = \sin\theta i + \sin(\theta d - \alpha) \quad (20)$$

Therefore, the quasi-synchronous tuning range also can be defined as a region comprising points that cause the frequency tuning range not less than $\Delta v$. Generally, such a region is larger than the region defined by Eqs. (10) and (11), and has more practical sense and merit.

According to the present disclosure, a corresponding grating external-cavity laser is also provided, which comprises a quasi-synchronous tuning mechanism for implementing the abovementioned quasi-synchronous tuning method. The quasi-synchronous tuning mechanism rotates the grating or the mirror around the quasi-synchronous tuning rotation center determined as above to achieve the quasi-synchronous tuning of frequency selections by the grating and resonance cavity. The grating external-cavity laser may in a Littman configuration or in a grazing-diffraction configuration, as well as a Littrow configuration. In the case of external-cavity semiconductor laser in Littrow configuration, the symmetrical axes of the two parabolas defined by Eq. (10) are parallel to the light incident on the grating, since the difference between the incidence angle and the diffraction angle is $\Delta\theta=0$. When the grating external-cavity laser is in Littman configuration or grazing diffraction configuration, in the case of performing tuning by rotating the grating around the quasi-synchronous tuning point ($P_q$) as rotation center, the symmetrical axes of the two parabolas defined by Eq. (10) are parallel to the bisector of the angle between the normal of the mirror M and the light emitted from the semiconductor laser diode LD, and in the case of performing tuning by mirror rotation, are parallel to the normal of the mirror M in its original position (that is, $\alpha=0$).

Hereinafter, particular embodiments of the present disclosure will be described taking commonly-used grating external-cavity semiconductor laser as example.

FIGS. 7-11 show various embodiments of determination of the quasi-synchronous tuning rotation center of grating external-cavity laser according to the present disclosure respectively.

Figure 7:
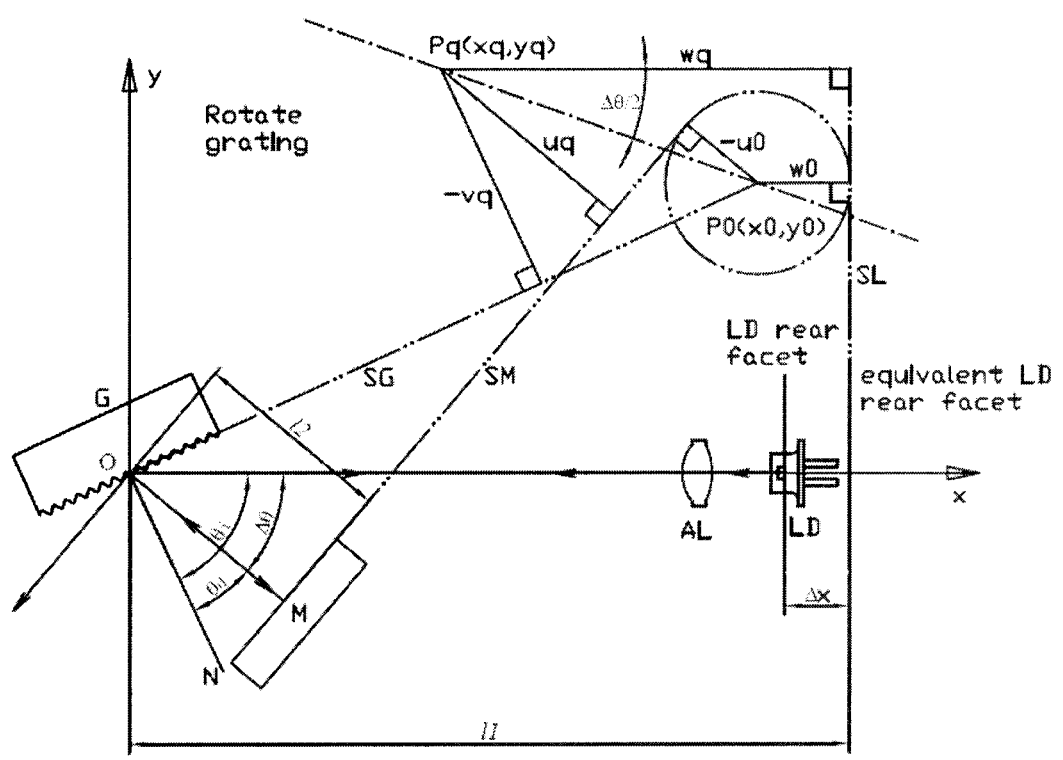
FIG. 7 shows the determination of quasi-synchronous tuning rotation center for Littman configuration in grating rotation tuning according to an embodiment of the present disclosure.
Figure 8:
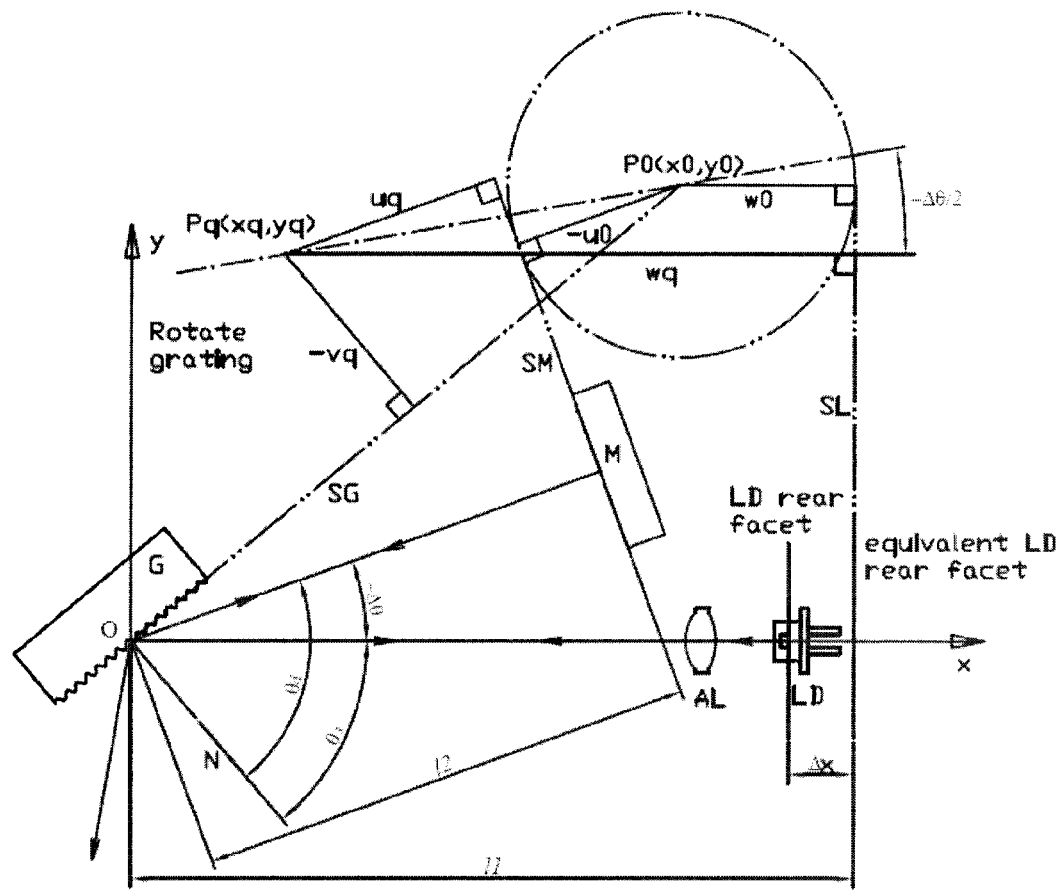
FIG. 8 shows the determination of quasi-synchronous tuning rotation center for grazing-diffraction configuration in grating rotation tuning according to an embodiment of the present disclosure.

FIGS. 7 and 8 show the cases of rotating the grating to perform tuning, wherein both of incidence angle $\theta_i$ and diffraction angle $\theta_d$ of light on the grating G vary. Therefore, on the xOy coordinate plane, from the perspective of actual physical space of the laser, the rotation center $P_q(x_q, y_q)$ satisfying the quasi-synchronous tuning condition can be considered as being extended, from the rotation center $P_0(x_0, y_0)$ under the conventional synchronous tuning condition, to a region enclosed by the two parabolas defined by Eq. (10) and a region bounded by the symmetrical axes of the two parabolas and outside the top of the two parabolas as defined by Eq. (11) near $P0(x_0, y_0)$.

As to the external-cavity semiconductor laser in grazing-incidence and grazing-diffraction configuration, when the tuning is performed by rotating grating (FIG. 7 and FIG. 8), the symmetrical axes of the two parabolas defined by Eq. (10) separate from the rigorous synchronous tuning point by distance ±b respectively, and are parallel to the bisector of the angle between the normal of mirror M and the light emitted from the semiconductor laser diode LD.

Figure 9:
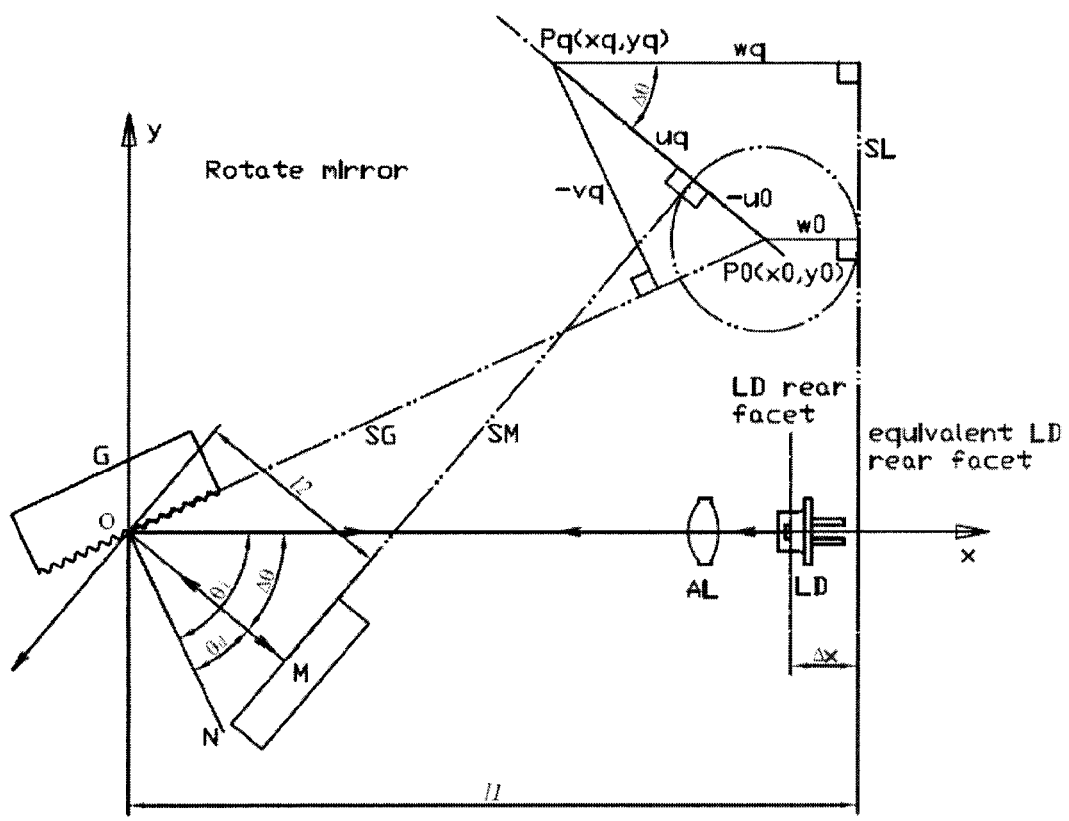
FIG. 9 shows the determination of quasi-synchronous tuning center for Littman configuration in mirror rotation tuning according to an embodiment of the present disclosure.
Figure 10:
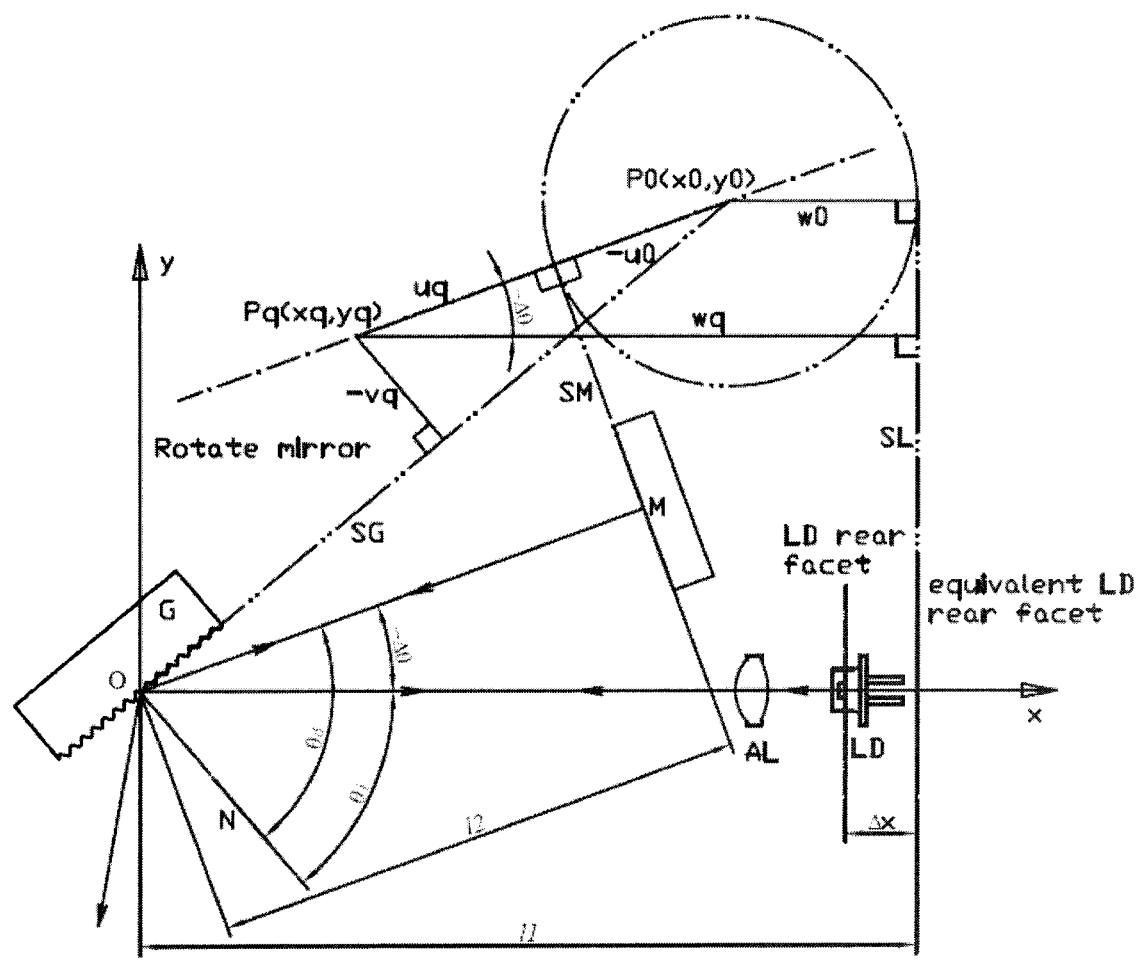
FIG. 10 shows the determination of quasi-synchronous tuning rotation center for grazing-diffraction configuration in mirror rotation tuning according to an embodiment of the present disclosure.
Figure 11:
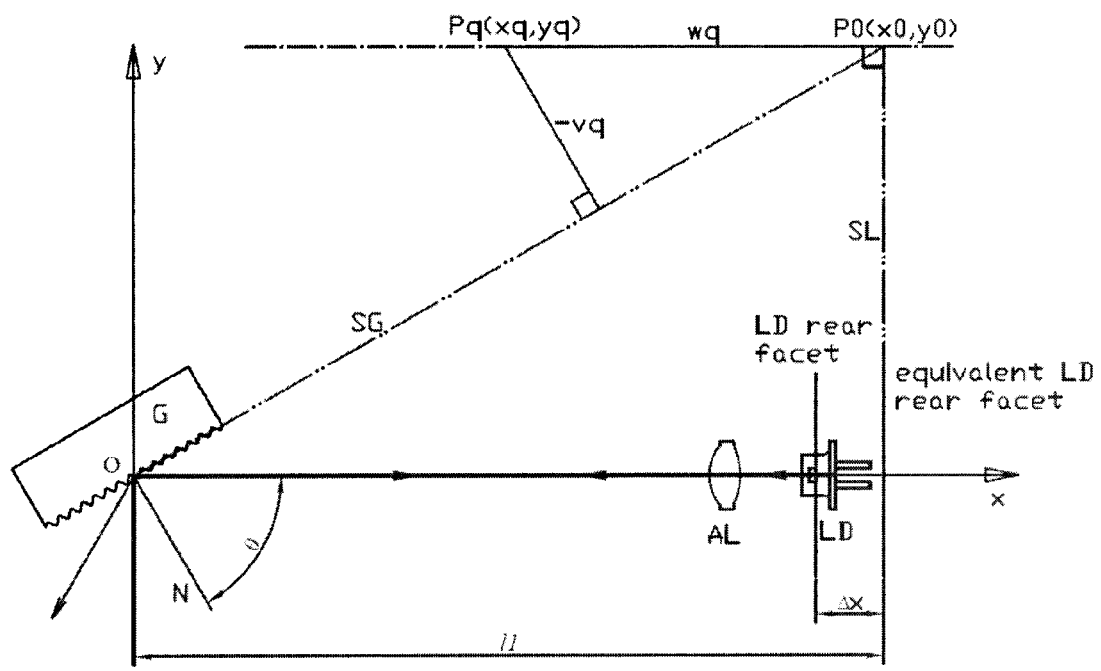
FIG. 11 shows the determination of quasi-synchronous tuning rotation center for Littrow configuration according to an embodiment of the present disclosure.

FIGS. 9 and 10 illustrate the case of performing tuning by rotating the mirror. In mirror rotation tuning (FIG. 9 and FIG. 10), the symmetrical axes of the two parabolas defined by Eq. (10) separate from the rigorous synchronous tuning point by distance ±b respectively, and are parallel to the normal of mirror M in its original position. As to the external-cavity seminconductor laser in Littrow configuration (FIG. 11), in which the mirror M corresponds to being coincident with the equivalent LD rear facet and the grating G is rotated to perform tuning, the symmetrical axes of the two parabolas defined by Eq. (10) separate from the rigorous synchronous tuning point by distance ±b respectively, and are parallel to the light emitted from the semiconductor laser diode LD. In the region determined according to the present disclosure, a large synchronous tuning range notably superior to other positions can be obtained, and more approaching to the synchronous tuning point $P_0(x_0, y_0)$, larger synchronous tuning range can be obtained.

Figure 12:
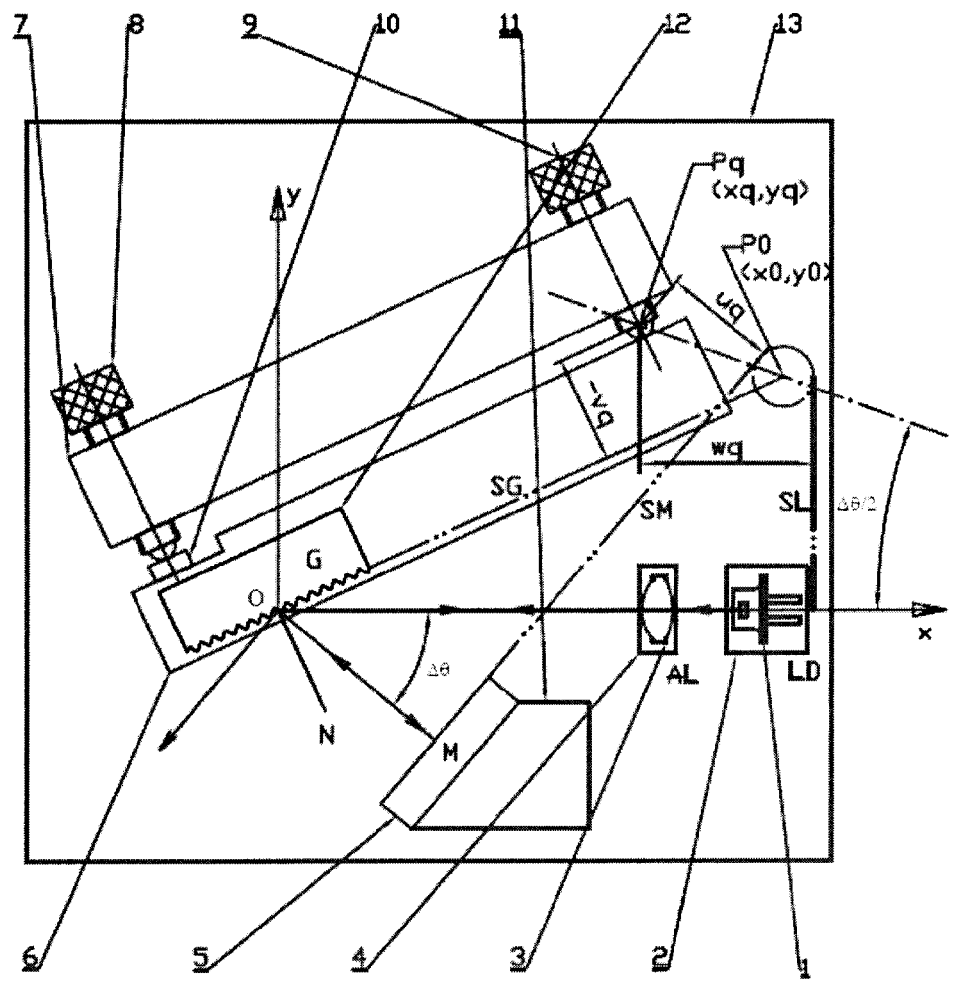
FIG. 12 shows the quasi-synchronous tuning mechanism of grating external-cavity semiconductor laser in Littman configuration in grating rotation tuning according to an embodiment of the present disclosure.
Figure 13:
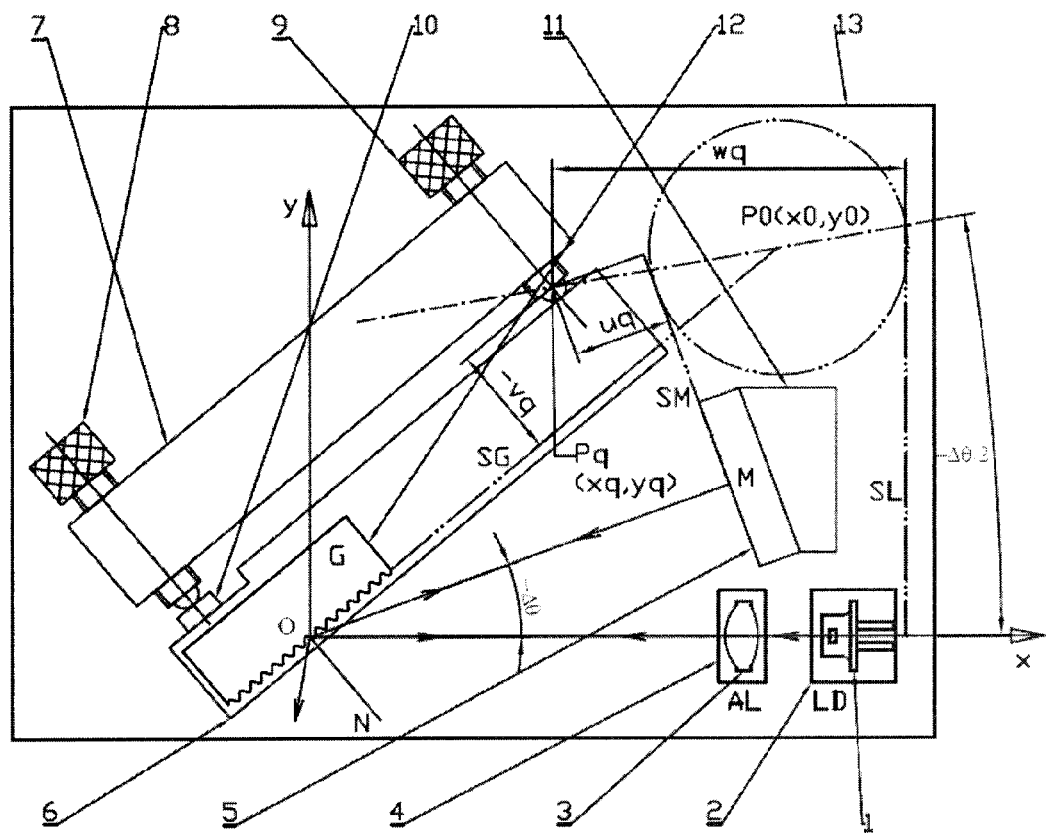
FIG. 13 shows the quasi-synchronous tuning mechanism of grating external-cavity semiconductor laser in grazing-diffraction configuration in grating rotation tuning according to an embodiment of the present disclosure.

FIGS. 12 and 13 show the quasi-synchronous tuning mechanisms of the external-cavity semiconductor lasers in grazing-incidence configuration and grazing-diffraction configuration in grating rotation tuning respectively.

As shown in FIG. 12, a laser beam emitted by the semiconductor diode LD at wavelength of 689 nm and output power of 30 mW is incident on a holographic diffraction grating G having groove density of 1800 g/mm, grooved area of 12.5 mm*12.5 mm, and thickness of 6 mm, as well as appropriate diffraction efficiency, after being collimated by an aspheric collimating lens AL having focal length of 4 mm and numerical aperture of 0.6, and the zero-order diffraction light or the direct mirror reflection light of the grating G is used as the output light beam of laser. The first-order diffraction light of the grating is normally incident on a planar mirror M, reverses its direction after the reflection of M, and returns to semiconductor diode LD along the path collinear with the original incident beam but in the opposite direction after the re-diffraction of the grating.

The laser diode LD, for example, utilizes temperature sensor and semiconductor cooler to realize temperature control by a heat sink 2. A specific implementation of the quasi-synchronous tuning mechanism will be described below: the collimating lens AL is adjusted and fixed by a lens holder 4, a diffraction grating G is fixed on an adjuster moving plate 6, the direction of the diffraction grating G can be adjusted by adjusting screws 8 and 9 on a adjuster fixed plate 7 and further finely adjusted by a piezoelectric ceramics 10 on the moving plate, and the mirror M is fixed on a base plate 13 by a fixing holder 11. Frequency selections by the external-cavity and the grating are realized by rotating the diffraction grating G around a quasi-synchronous rotation center $P_q$. For example, a coarse tuning can be made by varying the angle of diffraction grating G by means of adjusting screw 8, and/or a fine tuning can be made by applying a control voltage on the piezoelectric ceramics 10.

In the external-cavity semiconductor laser in Littman configuration shown in FIG. 12, quasi-synchronous tuning rotation center $P_q$ ($x_q$,$y_q$) around which the grating rotates locates in the quasi-synchronous tuning region described by Eqs. (10) and (11). Wherein, the symmetrical axes of the two parabolas defined by Eq. (10) separate from the rigorous synchronous tuning point by distance ±b respectively, and form a Δθ/2 angle with respect to the negative direction of x-axis, herein Δθ>0 as $θ_i$>$θ_d$.

The external-cavity semiconductor laser in grazing-diffraction configuration tuned by grating rotation shown in FIG. 13 is similar to the grazing-incidence configuration shown in FIG. 12, and the only difference is that the location of mirror M is different, which causing θi<θd, and thus Δθ<0. The quasi-synchronous tuning rotation center $P_q$ (xq,yq) around which the grating rotates also lies in the quasi-synchronous tuning region described by Eqs. (10) and (11). Wherein, the symmetrical axes of the two parabolas defined by Eq. (10) separate from the rigorous synchronous tuning point by distance ±b respectively, and form an angle of Δθ/2 with respect to the negative direction of the x-axis, but the inclined direction of this straight line is opposite to that of the straight line in FIG. 12.

Figure 14:
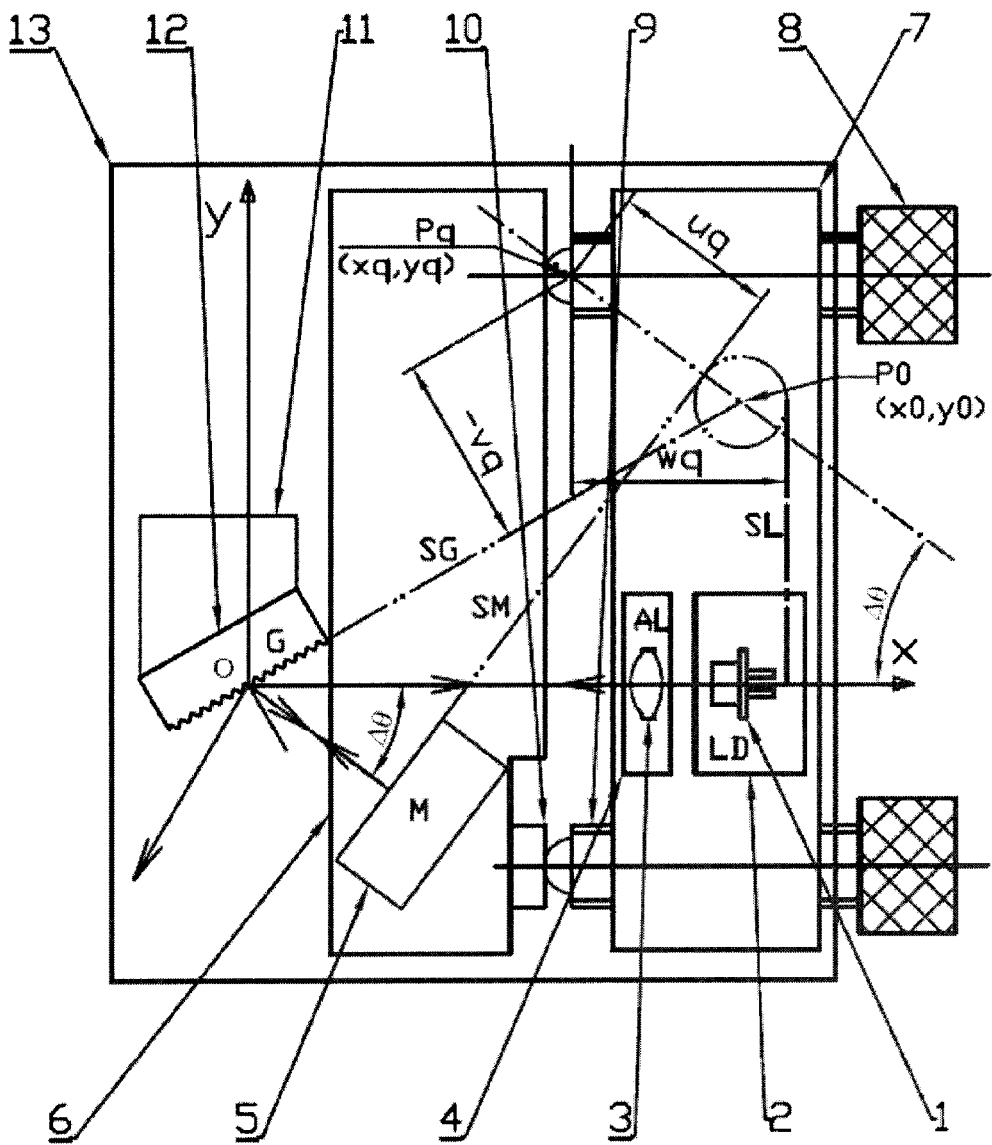
FIG. 14 shows the quasi-synchronous tuning mechanism of grating external-cavity semiconductor laser in Littman configuration in mirror rotation tuning according to an embodiment of the present disclosure.
Figure 15:
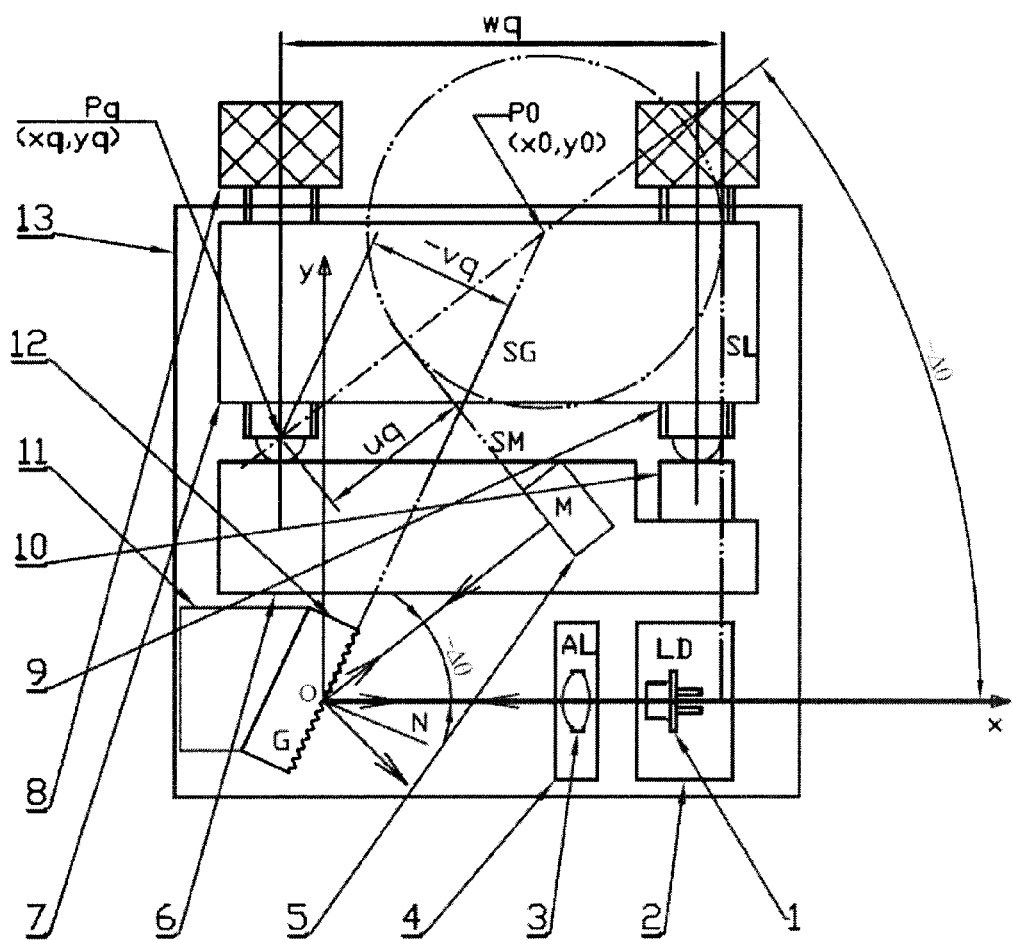
FIG. 15 shows the quasi-synchronous tuning mechanism of grating external-cavity semiconductor laser in grazing-diffraction configuration in mirror rotation tuning according to an embodiment of the present disclosure.

Similarly, FIGS. 14 and 15 show the quasi-synchronous tuning mechanisms of the external-cavity semiconductor lasers in grazing-incidence configuration and grazing-diffraction configuration in mirror rotation tuning, respectively.

In the quasi-synchronous tuning mechanisms shown in FIGS. 14 and 15, a grating G is fixed on a base plate 13 by a fixing holder 11, a mirror M is fixed on an adjuster moving plate 6, the direction of the mirror M can be adjusted by adjusting screws 8 and 9 on an adjuster fixed plate 7 and also finely adjusted by a piezoelectric ceramics 10 on the moving plate. The frequency selections by external-cavity and grating can be realized by rotating the mirror M around a quasi-synchronous tuning rotation center $P_q$. For example, a coarse tuning can be made by varying the angle of mirror M by means of adjusting screw 8, and/or a fine tuning can be made by applying a control voltage on the piezoelectric ceramics 10.

In the external-cavity semiconductor laser in Littman configuration tuned by mirror rotation shown in FIG. 14, the quasi-synchronous tuning rotation center $P_q$ ($x_q$,$y_q$) around which the mirror rotates lies in the quasi-synchronous tuning region described by Eqs. (10) and (11). Wherein, the symmetrical axes of the two parabolas defined by Eq. (10) separate from the rigorous synchronous tuning point by distance ±b respectively, and form an angle of Δθ with respect to the negative direction of the x-axis, herein Δθ>0 as $θ_i$>$θ_d$.

The external-cavity semiconductor laser in grazing-diffraction configuration quasi-synchronously tuned by mirror rotation shown in FIG. 15 is similar to the grazing-diffraction configuration shown in FIG. 14, and the only difference is that the location of mirror M is different, which causing θi<θd, and thus Δθ<0. The quasi-synchronous tuning center $P_q$ ($x_q$, $y_q$) around which the mirror rotates also lies in the quasi-synchronous tuning region described by Eqs. (10) and (11). Wherein, the symmetrical axes of the two parabolas defined by Eq. (10) separate from the rigorous synchronous tuning point by distance ±b respectively, and form an angle of Δθ with respect to the negative direction of the x-axis, but the inclined direction of this straight line is opposite to that of the straight line in FIG. 14.

Figure 16:
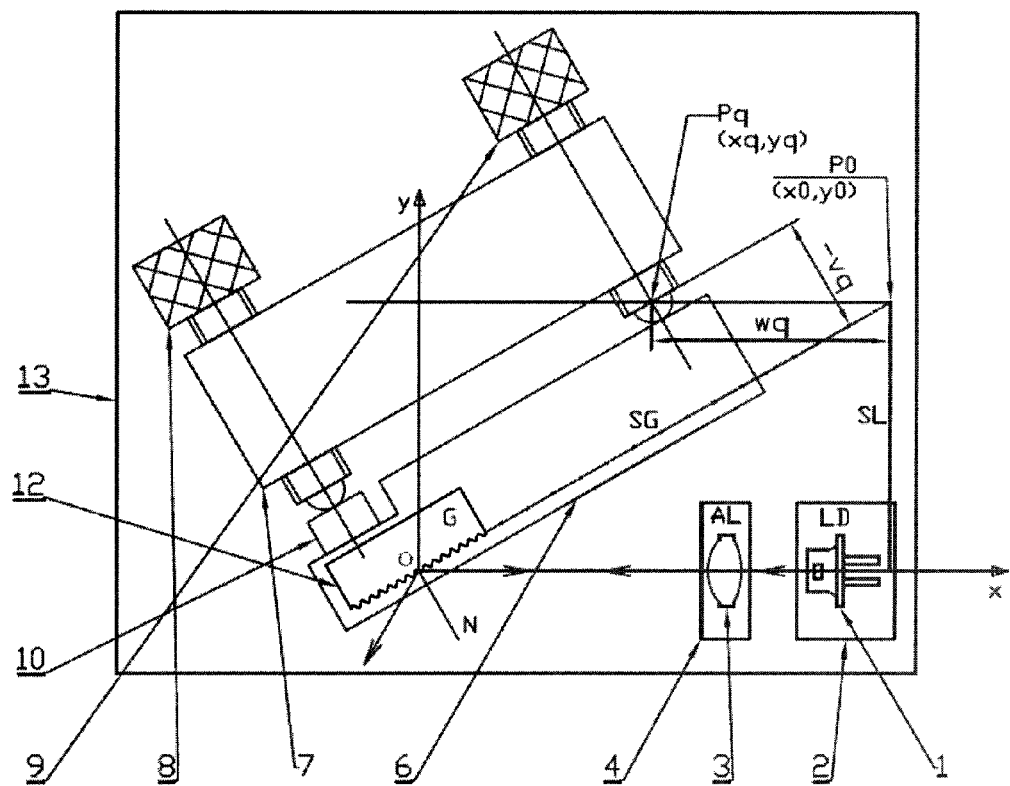
FIG. 16 shows the quasi-synchronous tuning mechanism of grating external-cavity semiconductor laser in Littrow configuration according to an embodiment of the present disclosure.

FIG. 16 is an illustration of a quasi-synchronous tuning external-cavity semiconductor laser in Littrow configuration, wherein $θ_i$=$θ_d$=θ. As shown in FIG. 16, the first-order diffraction light of the grating G returns to the semiconductor laser diode LD along a path collinear with the original incident beam but in the opposite direction. In the quasi-synchronous tuning mechanism thereof, the grating G is fixed on an adjuster moving plate 6 which can be adjusted through adjusting screws 8 and 9 on an adjuster fixed plate 7. Laser wavelength tuning can be realized by rotating the diffraction grating G around a quasi-synchronous tuning rotation center $P_q$. For example, the angle of the light beam incident on the diffraction grating G can be changed by finely adjusting screw 8 and/or piezoelectric ceramics 10, and alignment adjustment of the quasi-synchronous tuning rotation center Pq and the grating G can be realized by adjusting screw 9.

It can be seen from FIG. 16 that, in the external-cavity semiconductor laser in Littrow configuration, quasi-synchronous tuning rotation center $P_q$ ($x_q$,$y_q$) lies in the quasi-synchronous tuning region described by Eqs. (10) and (11). Wherein, the symmetrical axes of the two parabolas defined by Eq. (10) separate from the rigorous synchronous tuning point by distance ±b respectively, and are parallel to the x-axis.

Figure 17:
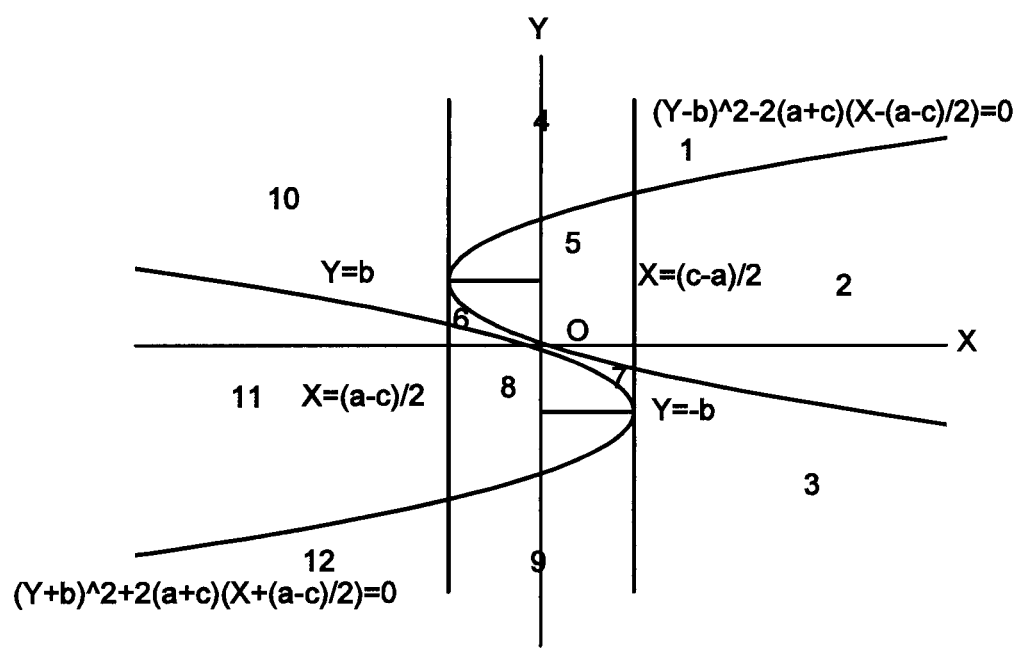
FIG. 17 shows the quasi-synchronous tuning region division of the laser in mirror tuning.

FIG. 17 shows the quasi-synchronous tuning region division of the laser in mirror tuning. As shown in FIG. 17, regions 2, 5, 6, 7, 8, 11 form an extended the quasi-synchronous tuning region.

Those skilled in the art will appreciate that, the laser light source of the grating external-cavity laser in the above examples may use other types of laser light source in addition to the semiconductor laser diode, and may have other wavelength and output power, the grating can be a blazed grating or a transmission grating, which may have other groove density, size or thickness, the collimating lens may have other focal length and numerical aperture as well. In addition, a ½ wave plate may be disposed between the laser light source and the grating to adjust the feedback power.

What is claimed is:

1. A method for quasi-synchronous tuning of a grating external-cavity laser to achieve quasi-synchronous tuning of frequency selections, wherein the laser comprises a semiconductor laser diode, a grating, and a mirror, the method comprising:

determining a synchronous tuning point $P_0$($x_0$,$y_0$), the synchronous tuning point having a position such that when the grating or the mirror rotates about the synchronous tuning point $P_0$, a round trip phase difference of a laser beam, emitted by the semiconductor laser diode, within a resonance cavity of the grating external-cavity laser does not change;

determining a quasi-synchronous tuning range by:

making a coordinate transformation from an x-y plane to an X-Y plane:

for a tuning by rotating the grating, $$\begin{cases} Y = \left[(x-x_0)\sin\frac{\Delta\theta}{2} + (y-y_0)\cos\frac{\Delta\theta}{2}\right] \\ X = \left[(x-x_0)\cos\frac{\Delta\theta}{2} - (y-y_0)\sin\frac{\Delta\theta}{2}\right] \end{cases} \quad (8)$$

for a tuning by rotating the mirror, $$\begin{cases} Y = (x-x_0)\sin\Delta\theta + (y-y_0)\cos\Delta\theta \\ X = (x-x_0)\cos\Delta\theta - (y-y_0)\sin\Delta\theta \end{cases} \quad (9)$$

determining an optical length $l(\alpha)$ and a boundary condition at which mode hopping occurs:

for the tuning by rotating the grating, $$l(\alpha) = \frac{SS(\alpha)}{SS(0)}\left[l_0 - \frac{2\cos\frac{\Delta\theta}{2}SS(0)}{SS(\alpha)}[Y\sin\alpha + X(1-\cos\alpha)]\right] \quad (17)$$

$$\frac{2\cos\frac{\Delta\theta}{2}|Y\sin\alpha + X(1-\cos\alpha)|}{SS(\alpha)} \leq \frac{\lambda(0)}{4}\frac{1}{SS(0)} \quad (18)$$

where, $$SS(\alpha) = \sin(\theta i - \alpha) + \sin(\theta d - \alpha) \quad (19),$$

for the tuning by rotating the mirror, $$l(\alpha) = \frac{SS(\alpha)}{SS(0)}\left[l_0 - \frac{SS(0)}{SS(\alpha)}[Y\sin\alpha + X(1-\cos\alpha)]\right] \quad (15)$$

$$\frac{|Y\sin\alpha + X(1-\cos\alpha)|}{SS(\alpha)} \leq \frac{\lambda(0)}{4}\frac{1}{SS(0)} \quad (16)$$

where, $$SS(\alpha) = \sin\theta i + \sin(\theta d - \alpha) \quad (20);$$

wherein the quasi-synchronous tuning range comprises a region in the X-Y plane comprising points whose corresponding frequency tuning range being not less than $\Delta v$, where:

$$\Delta v = \frac{c}{\lambda(0)}\left(\frac{l_0}{1(a_+)} - \frac{l_0}{1(\alpha_-)}\right) \quad (14)$$

where c is the light speed in vacuum, $\lambda(0)$ is the central wavelength of laser light, $l_0$ is the original cavity length of the laser, $\alpha_\pm$ are the maximal mode-hopping-free tuning angles allowed in positive and negative directions respectively, $\Delta\theta = \theta_i - \theta_d$, $\theta_i$ is an incidence angle of the laser beam on the grating, and $\theta_d$ is a diffraction angle of the laser beam on the grating;

selecting one point in the quasi-synchronous tuning range as a quasi-synchronous tuning point $P_q$; and rotating the grating or the mirror around the quasi-synchronous tuning point, wherein a distance from the quasi-synchronous tuning point to a plane on which a diffraction surface of the grating lies or to a plane on which a reflection surface of the mirror lies does not change during the rotation about the quasi-synchronous tuning point.

2. The method according to claim 1, wherein the quasi-synchronous tuning range comprises a region enclosed by two parabolas described by Eq.(10) and a region bounded between two symmetrical axes of the parabolas and outside tops of the parabolas as described by Eq.(11):

$$\begin{cases} X \leq -\frac{(Y+b)^2}{2(a+c)} - \frac{a-c}{2} \\ X \geq \frac{(Y-b)^2}{2(a+c)} + \frac{a-c}{2} \end{cases} \quad (10)$$

$$-b \leq Y \leq b \quad (11)$$

and $$-\frac{(Y+b)^2}{2(a+c)} - \frac{a-c}{2} \leq X \leq \frac{(Y-b)^2}{2(a+c)} + \frac{a-c}{2}$$

wherein, a, b, and c are defined as:
for the tuning by rotating the grating, $$a = \frac{\lambda(0)}{8\cos\frac{\Delta\theta}{2}} \qquad (12)$$

$$b = \frac{\lambda(0)}{8\cos\frac{\Delta\theta}{2}} \frac{\cos(\theta i) + \cos(\theta d)}{SS(0)}$$

$$c = 0, \text{ and}$$

for the tuning by rotating the mirror, $$a = \frac{\lambda(0)}{4} \frac{\sin\theta d}{SS(0)} \qquad (13)$$

$$b = \frac{\lambda(0)}{4} \frac{\cos\theta d}{SS(0)}$$

$$c = \frac{\lambda(0)}{4} \frac{\sin\theta i}{SS(0)}.$$

3. The method according to claim 2, wherein the grating external cavity laser is in a Littman configuration or a grazing diffraction configuration, and is tuned by rotating the grating or the mirror around the quasi-synchronous tuning point (Pq), and wherein the symmetrical axes of the two parabolas defined by Eq.(10) separate from the synchronous tuning point by distances ±b, respectively, and are:

approximately parallel to a bisector of an angle between a normal of the mirror and the laser beam for the tuning by rotating the grating, and parallel to the normal of the mirror in its original position for the tuning by rotating the mirror.

4. The method according to claim 2, wherein the grating external cavity laser is in a Littrow configuration and is tuned by rotating the grating around the quasi-synchronous tuning point ($P_q$), and wherein the symmetrical axes of the two parabolas defined by Eq.(10) separate from the synchronous tuning point by distances ±b, respectively, and are parallel to the laser beam incident on the grating.

* * * * *